(12) United States Patent
Homer et al.

(10) Patent No.: US 7,991,573 B2
(45) Date of Patent: Aug. 2, 2011

(54) INTEGRATED CIRCUIT INCLUDING CALIBRATION CIRCUIT

(75) Inventors: Russell Homer, Los Gatos, CA (US);
Luca Ravezzi, Palo Alto, CA (US);
Hamid Partovi, Los Altos, CA (US)

(73) Assignee: Qimonda AG, Munich (DE)

( * ) Notice: Subject to any disclaimer, the term of this patent is extended or adjusted under 35 U.S.C. 154(b) by 181 days.

(21) Appl. No.: 11/960,069

(22) Filed: Dec. 19, 2007

(65) Prior Publication Data
US 2009/0164165 A1 Jun. 25, 2009

(51) Int. Cl.
*G01R 35/00* (2006.01)
(52) U.S. Cl. ........... 702/107; 702/1; 702/85; 702/89; 702/127; 702/189; 702/190
(58) Field of Classification Search .......... 702/85, 702/1, 89, 107, 127, 189, 190
See application file for complete search history.

(56) References Cited

U.S. PATENT DOCUMENTS

| | | | |
|---|---|---|---|
| 5,087,914 A | 2/1992 | Sooch et al. | |
| 5,463,346 A * | 10/1995 | Brooks | 327/553 |
| 6,118,384 A * | 9/2000 | Sheldon et al. | 340/636.15 |
| 6,636,821 B2 | 10/2003 | Lawson | |
| 6,940,303 B2 * | 9/2005 | Vargas | 326/30 |
| 6,946,848 B2 * | 9/2005 | Tauber et al. | 324/601 |
| 7,019,556 B2 | 3/2006 | Yoo | |
| 7,076,384 B1 * | 7/2006 | Radulov et al. | 702/85 |
| 7,088,129 B2 | 8/2006 | Humphrey et al. | |
| 7,135,884 B1 | 11/2006 | Talbot et al. | |
| 7,161,513 B2 | 1/2007 | Werner et al. | |
| 2003/0016064 A1 * | 1/2003 | Hartmann et al. | 327/172 |
| 2005/0069394 A1 | 3/2005 | Dyer et al. | |
| 2005/0264300 A1 * | 12/2005 | Chang et al. | 324/601 |
| 2006/0087339 A1 * | 4/2006 | Chung et al. | 326/30 |
| 2006/0184333 A1 * | 8/2006 | Stern | 702/106 |
| 2007/0057702 A1 * | 3/2007 | Suenaga | 327/108 |
| 2007/0120582 A1 * | 5/2007 | Chung et al. | 327/112 |
| 2007/0139086 A1 * | 6/2007 | Liu | 327/108 |
| 2008/0068040 A1 * | 3/2008 | Morishima et al. | 326/30 |
| 2009/0058473 A1 * | 3/2009 | Hunter | 327/95 |

* cited by examiner

*Primary Examiner* — Sujoy K Kundu
(74) *Attorney, Agent, or Firm* — Dicke, Billig, & Czaja, PLLC (57) ABSTRACT

One embodiment provides an integrated circuit including a first circuit, a second circuit, and a third circuit. The first circuit is configured to provide a calibrated signal. The second circuit is configured to low pass filter the calibrated signal and provide a filtered calibrated signal. The third circuit is configured to provide a control signal and store the control signal based on the filtered calibrated signal. The third circuit averages stored controlled signals to provide a calibration result.

17 Claims, 6 Drawing Sheets

INTEGRATED CIRCUIT INCLUDING CALIBRATION CIRCUIT

BACKGROUND

Typically, an electronic system includes a number of integrated circuits that communicate with one another to perform system applications. The integrated circuits can be on the same integrated circuit chip or on separate integrated circuit chips. Often, the electronic system includes one or more host controllers and one or more electronic subsystem assemblies, such as a dual in-line memory module (DIMM), a graphics card, an audio card, a facsimile card, and/or a modem card. Typically, a DIMM includes random access memory (RAM) chips, such as double data rate dynamic random access memory (DDR-DRAM) chips. The DDR-DRAM chips can be any suitable type and generation of DDR-DRAM.

To perform system functions, the host controller(s) and subsystem assemblies communicate via communication links, such as serial communication links and parallel communication links. Serial communication links include links that implement the fully buffered DIMM (FB-DIMM) advanced memory buffer (AMB) standard or any other suitable serial communication link interface.

Integrated circuit chip speeds continue to increase and the amount of data communicated between circuits continues to increase to meet the demands of system applications. As the volume of digital data communicated between circuits continues to increase, higher bandwidth communication links are needed to prevent data communication bottlenecks between circuits and/or chips. To achieve higher speeds and optimize signal timing between circuits and/or chips, the output impedances of drivers are calibrated to targeted values. Often, common mode noise and single ended noise affect the accuracy of the calibration and produce imprecise calibrated output impedances.

For these and other reasons there is a need for the present invention.

SUMMARY

The present disclosure describes an integrated circuit including a calibration circuit. One embodiment provides an integrated circuit including a first circuit, a second circuit, and a third circuit. The first circuit is configured to provide a calibrated signal. The second circuit is configured to low pass filter the calibrated signal and provide a filtered calibrated signal. The third circuit is configured to provide a control signal and store the control signal based on the filtered calibrated signal. The third circuit averages stored controlled signals to provide a calibration result.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
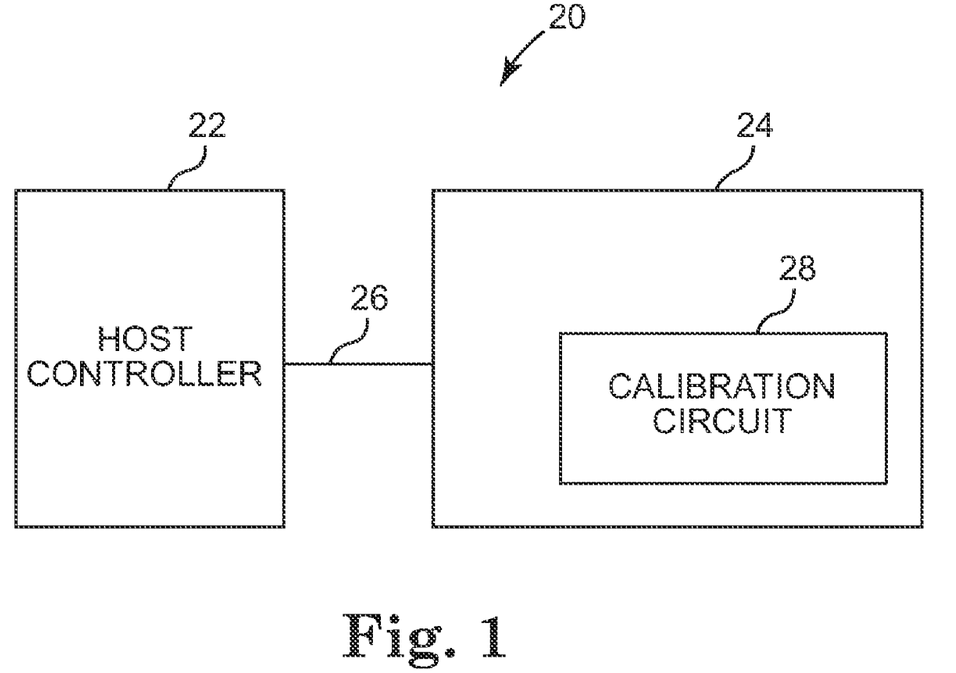
FIG. 1 is a diagram illustrating one embodiment of an electronic system according to the present invention.

FIG. 1 is a diagram illustrating one embodiment of an electronic system 20 according to the present invention. Electronic system 20 includes a host controller 22 and a subsystem assembly 24. Host controller 22 is electrically coupled to subsystem assembly 24 via communications link 26. In one embodiment, subsystem assembly 24 includes multiple integrated circuit chips. In one embodiment, subsystem assembly 24 is a single integrated circuit chip.

Host controller 22 controls subsystem assembly 24 via communications link 26 to provide one or more system functions. In one embodiment, host controller 22 is a memory controller. In one embodiment, subsystem assembly 24 is an FB-DIMM and host controller 22 controls the FB-DIMM to provide a system memory function. In other embodiments, subsystem assembly 24 can be any suitable subsystem assembly, such as a graphics card, an audio card, a facsimile card, or a modem card, and host controller 22 controls the subsystem assembly 24 to provide the corresponding system function.

Subsystem assembly 24 includes a calibration circuit 28 that calibrates a circuit parameter in subsystem assembly 24. Calibration circuit 28 provides a control signal that sets or adjusts the circuit parameter or a substitute for the circuit parameter. A calibrated signal that corresponds to the adjusted circuit parameter is low pass filtered to provide a filtered calibrated signal. The filtered calibrated signal is compared to a low pass filtered reference signal to obtain a comparison result. The control signal, which adjusts the circuit parameter and the calibrated signal, is updated based on the comparison result.

In one embodiment, the comparison result is sampled and the control signal is incremented in one direction or decremented in another direction to provide an updated control signal. If the comparison result changes, calibration circuit 28 switches from incrementing to decrementing the control signal or from decrementing to incrementing the control signal to obtain the updated control signal. If the comparison result does not change, calibration circuit 28 increments or decrements the control signal in the same direction to obtain the updated control signal. In one embodiment, calibration circuit 28 includes a finite state machine (FSM).

Calibration circuit 28 includes an averaging digital filter for obtaining the calibration result. If the comparison result changes, the control signal that caused the comparison result to change is stored. If the comparison result does not change, an updated control signal is provided to adjust the circuit parameter and update the filtered calibrated signal. Stored control signals are averaged to provide the calibration result.

In one embodiment, calibration circuit 28 provides a pre-emphasis signal in the control signals. The pre-emphasis signal over adjusts the circuit parameter, which results in a pre-emphasis pulse in the calibrated signal. The pre-emphasis signal and the resulting pre-emphasis pulse decrease the time it takes to change the filtered calibrated signal to the updated filtered calibrated signal.

In one embodiment, subsystem assembly 24 is an FB-DIMM or multiple FB-DIMMs. Each of the FB-DIMMs includes an AMB that provides a serial communications link and each of the AMBs includes one or more calibration circuits 28 that calibrate output impedances in AMB output drivers. In other embodiments, host controller 22 and subsystem assembly 24 communicate via any suitable communications link.

Calibration circuit 28 low pass filters the reference signal and the calibrated signal and includes an averaging digital filter for obtaining the calibration result. The low pass filters and the averaging digital filter reduce common mode noise and single ended noise in calibration circuit 28, which improves the accuracy of the calibration and provides more precisely calibrated circuit parameters. In one embodiment, calibration circuit 28 calibrates the output impedances of output drivers in subsystem assembly 24 to optimize signal timing and achieve higher data rates between circuits and/or chips. In one embodiment, host controller 22 includes one or more calibration circuits, such as calibration circuit 28.

Figure 2:
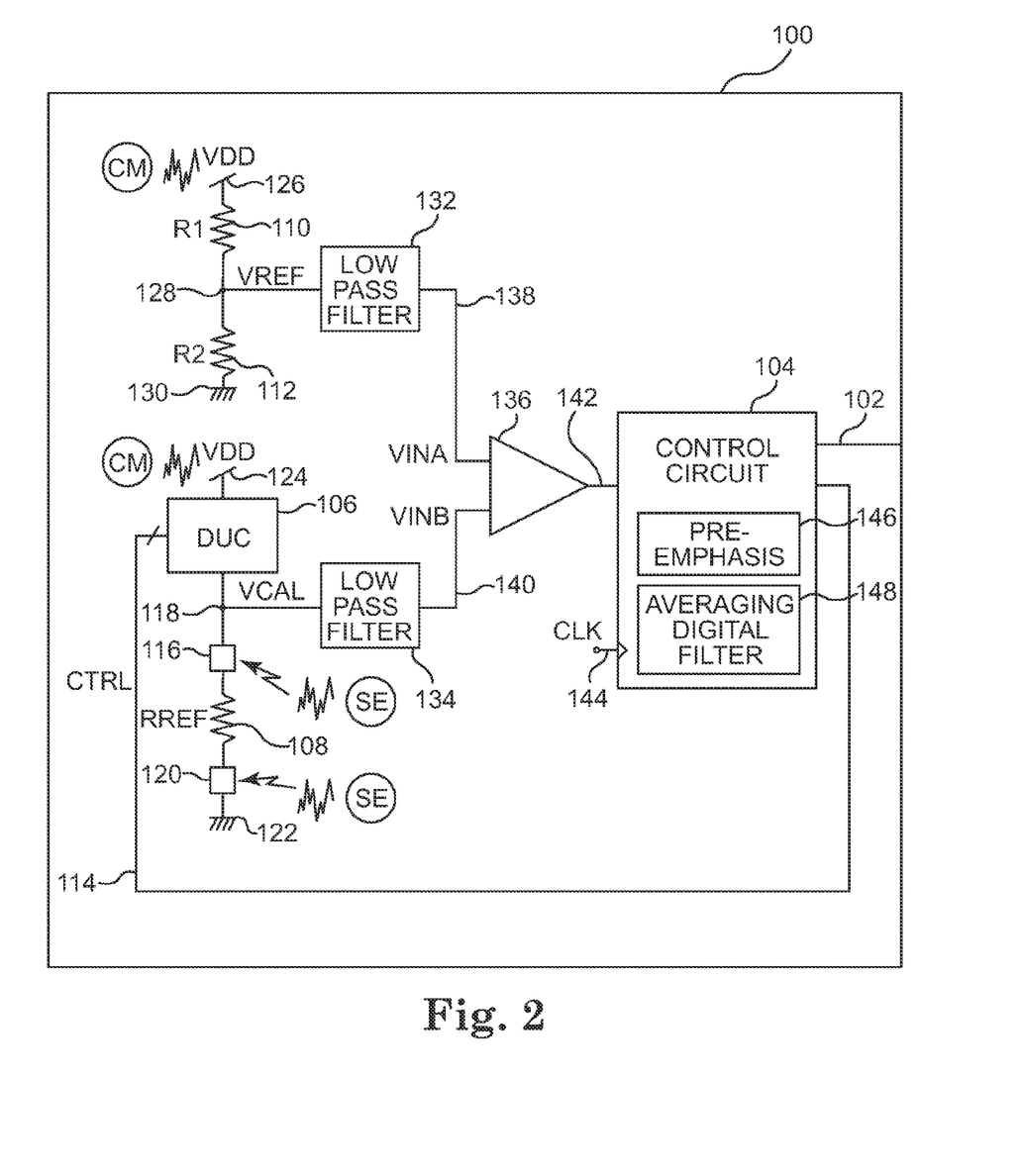
FIG. 2 is a diagram illustrating one embodiment of a calibration circuit.

FIG. 2 is a diagram illustrating one embodiment of a calibration circuit 100 that calibrates output impedances of output drivers. Calibration circuit 100 provides a calibration result to the output drivers via calibration signal path 102. The calibration result calibrates adjustable output impedances in the output drivers. By calibrating the output impedances of the output drivers, signal timing can be optimized and higher data rates can be achieved between circuits and/or chips. Calibration circuit 100 is similar to calibration circuit 28 (shown in FIG. 1).

Calibration circuit 100 includes control circuit 104, a device or driver under calibration (DUC) 106, a reference resistor RREF at 108, a first resistor R1 at 110, and a second resistor R2 at 112. Control circuit 104 is electrically coupled to DUC 106 via control signal path 114. DUC 106 includes adjustable output impedance ZDUC, which is programmed by control circuit 104 via control signal CTRL at 114. Calibration circuit 100 calibrates the output impedance of DUC 106 to obtain the calibration result provided to the output drivers via calibration signal path 102. DUC 106 is a replica of the output drivers being calibrated. In other embodiments, DUC 106 is one of the output drivers being calibrated.

Reference resistor RREF at 108 is a precision resistor used to calibrate DUC 106. One side of reference resistor RREF at 108 is electrically coupled to pad 116, which is electrically coupled to DUC 106 via calibrated signal path 118. The other side of reference resistor RREF at 108 is electrically coupled to pad 120, which is electrically coupled to a reference, such as ground, at 122. DUC 106 is electrically coupled to power supply voltage VDD at 124 and to pad 116 and reference resistor RREF at 108 via calibrated signal path 118. DUC 106 provides the adjustable output impedance ZDUC between power supply voltage VDD at 124 and calibrated signal path 118. Current flows from power supply voltage VDD at 124 through the output impedance ZDUC of DUC 106 and reference resistor RREF at 108 to the reference at 116 to provide the calibrated voltage signal VCAL at 118.

First resistor R1 at 110 and second resistor R2 at 112 provide a reference voltage VREF, which is used to calibrate DUC 106. One side of first resistor R1 at 110 is electrically coupled to power supply voltage VDD at 126 and the other side of first resistor R1 at 110 is electrically coupled to one side of second resistor R2 at 112 via reference signal path 128. The other side of second resistor R2 at 112 is electrically coupled to a reference, such as ground, at 130. Current flows from power supply voltage VDD at 126 through first resistor R1 at 110 and second resistor R2 at 112 to the reference at 130 to provide the reference voltage VREF at 128.

The values of first resistor R1 at 110 and second resistor R2 at 112 are chosen to provide a ratio of R1/R2 that is equal to the ratio of ZDUC/RREF, after ZDUC has been calibrated to a targeted impedance value. Control circuit 104 provides control signal CTRL at 114 to adjust impedance ZDUC of DUC 106. As ZDUC approaches the targeted impedance value, the voltage VCAL at 118 becomes substantially the same as the voltage VREF at 128 as shown in EQUATION I.

$$ZDUC/RREF \rightarrow R1/R2$$

$$VCAL \rightarrow VREF \qquad \text{EQUATION I}$$

In low power applications, first resistor R1 at 110 and second resistor R2 at 112 have higher impedance values than in non-low power applications.

Calibration circuit 100 also includes a first low pass filter 132, a second low pass filter 134, and a comparator 136. The input of first low pass filter 132 is electrically coupled to first resistor R1 at 110 and second resistor R2 at 112 via reference signal path 128. The output of first low pass filter 132 is electrically coupled to an input of comparator 136 via input path 138. The input of second low pass filter 134 is electrically coupled to DUC 106 and reference resistor RREF at 108 via calibrated signal path 118. The output of second low pass filter 134 is electrically coupled to another input of comparator 136 via input path 140.

First low pass filter 132 receives and low pass filters reference signal VREF at 128 and provides an input signal, filtered reference signal VINA at 138, to comparator 136. Second low pass filter 134 receives and low pass filters the calibrated signal VCAL at 118 and provides another input signal, filtered calibrated signal VINB at 140, to comparator 136. First low pass filter 132 and second low pass filter 134 perform multiple functions. First low pass filter 132 and second low pass filter 134 function as anti-aliasing filters by reducing high frequency signals. Second low pass filter 134 also reduces single ended (SE) noise introduced into the system at 116 and 122. In addition, first low pass filter 132 and second low pass filter 134 reduce common mode (CM) noise introduced into the system at 124 and 126.

First low pass filter 132 and second low pass filter 134 are configured to provide substantially the same transfer function from power supply voltage VDD to the inputs of comparator 136. First low pass filter 132 contributes to providing a first transfer function from power supply voltage VDD at 126 to the filtered reference signal VINA at 138 at the one input of comparator 136. Second low pass filter 134 contributes to providing a second transfer function from power supply voltage VDD at 124 to the filtered calibrated signal VINB at 140 at the other input of comparator 136. The first transfer function is substantially the same as the second transfer function to minimize conversion of CM noise to differential noise at the inputs of comparator 136.

Comparator 136 receives and compares filtered reference signal VINA at 138 and filtered calibrated signal VINB at 140 and provides a comparison result. Comparator 136 is electrically coupled to control circuit 104 via comparator output path 142. If filtered reference signal VINA at 138 is greater than filtered calibrated signal VINB at 140, comparator 136 provides one comparison result at 142 to control circuit 104 via comparator output path 142. If filtered reference signal VINA at 138 is less than filtered calibrated signal VINB at 140, comparator 136 provides a different comparison result at 142 to control circuit 104 via comparator output path 142.

Control circuit 104 receives the comparison result at 142 and a clock signal CLK at 144 and provides control signal CTRL at 114. DUC 106 receives control signal CTRL at 114 and adjusts the output impedance ZDUC of DUC 106. The adjusted output impedance ZDUC and reference resistor 108 provide calibrated signal VCAL at 118. Second low pass filter 134 receives calibrated signal VCAL at 118 and provides the filtered calibrated signal VINB at 140. Comparator 136 compares filtered reference signal VINA at 138 and filtered calibrated signal at 140 and provides a comparison result at 142. Control circuit 104 samples the comparison result at 142.

Control circuit 104 sweeps, e.g. increments or decrements, control signal CTRL at 114 in one direction, which changes the values of output impedance ZDUC in DUC 106, calibrated signal VCAL at 118, and filtered calibrated signal VINB at 140 in one direction. If the comparison result at 142 does not change from one sample to the next, control circuit 104 continues sweeping control signal CTRL at 114 in the same direction. If the comparison result at 142 does change from one sample to the next, control circuit 104 stores the control signal CTRL at 114 that caused the change and switches the direction of sweeping control signal CTRL at 114. Next, control circuit 104 sweeps control signal CTRL at 114 until comparator 136 provides another change in the comparator result at 142. Control circuit 104 stores the control signal CTRL at 114 that caused the change and, once again, switches the direction of sweeping control signal CTRL at 114. This process continues until a number N control signals CTRL at 114 are stored. In one embodiment, control signal CTRL at 114 is a digital code. In one embodiment, control circuit 104 increments control signal CTRL at 114 to sweep control signal CTRL at 114 in one direction and control circuit 104 decrements control signal CTRL at 114 to sweep control signal CTRL at 114 in the other direction. In one embodiment, control circuit 104 is a finite state machine (FSM).

After each update of control signal CTRL at 114, control circuit 104 waits a period of time to allow signals, including calibrated signal VCAL at 118, filtered calibrated signal VINB at 140, and the comparison result at 142, to complete their transients and settle. In one embodiment, control circuit 104 waits a number of clock cycles to allow signals to complete their transients and settle.

Control circuit 104 includes a pre-emphasis function 146 and an averaging digital filter 148. Each time control circuit 104 updates control signal CTRL at 114 to increase (decrease) the filtered calibrated signal VINB at 140 one step value, the pre-emphasis function 146 provides a pre-emphasis control signal in control signal CTRL at 114. The pre-emphasis control signal adjusts output impedance ZDUC in DUC 106 to increase (decrease) the calibrated signal VCAL at 118 greater than one step value and provide a pre-emphasis calibrated signal pulse in calibrated signal VCAL at 118. The pre-emphasis control signal is provided in control signal CTRL at 114 for part of the time between updates of control signal CTRL at 114. This results in a pre-emphasis calibrated signal for part of the time between updates of control signal CTRL at 114. In one embodiment, the pre-emphasis control signal and the pre-emphasis calibrated signal are provided at the beginning of an updated control signal CTRL at 114. In one embodiment, the pre-emphasis control signal and the pre-emphasis calibrated signal are provided during the first 25% of an updated control signal CTRL at 114. In one embodiment, the pre-emphasis control signal and the pre-emphasis calibrated signal have a duration based on a clock period. In one embodiment, the pre-emphasis control signal and the pre-emphasis calibrated signal have a duration based on a resistor and capacitor circuit. In one embodiment, the pre-emphasis control signal and the pre-emphasis calibrated signal have a magnitude that is at least two times a single step response.

After the pre-emphasis control signal, control signal CTRL at 114 is set to a control signal value that maintains the one step value increase (decrease) in the filtered calibrated signal VINB at 140. The pre-emphasis calibrated signal in calibrated signal VCAL at 118 decreases the transition time of filtered calibrated signal VINB at 140 from one value to the next higher (lower) value. Since filtered calibrated signal VINB at 140 transitions more quickly from one value to the next higher (lower) value, the comparison result at 142 can be sampled and control signal CTRL at 114 can be updated at a faster rate.

As part of the averaging digital filter 148, control circuit 104 stores control signal CTRL at 114 each time the sampled comparison result changes. Averaging digital filter 148 sums the N stored control signals and divides the sum by the number N. The result is an average of the stored control signals, which is provided as the calibration result to output drivers via calibration signal path 102.

Figure 3:
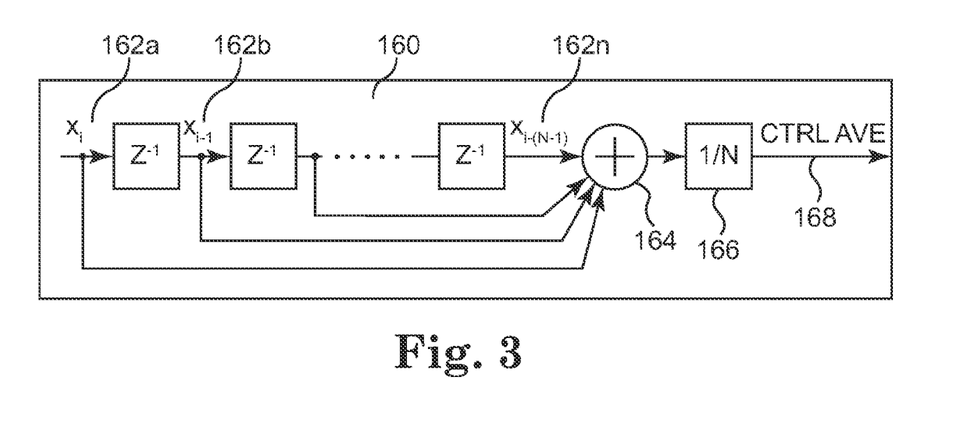
FIG. 3 is a diagram illustrating the operation of one embodiment of the averaging digital filter in the Z domain.

FIG. 3 is a diagram illustrating the operation of one embodiment of the averaging digital filter 148 (shown in FIG. 2) in the Z-domain 160. Control circuit 104 stores N control signals CTRL at 114 based on changes in the comparison results at 142. The N stored control signals are represented as Xi to Xi−(N−1) at 162a-162n. The N stored control signals at 162a-162n are summed at summation 164. At 166, the summation result is divided by N to obtain the average control signal value at 168 of the N stored control signals at 162a-162n. The average control signal value at 168 is provided to the output drivers as the calibration result.

The transfer function in the Z domain of the averaging digital filter 148 is shown in EQUATION II.

$$\mathrm{Avg}(z)=(1+z^{-1}+\ldots+z^{-(N-1)})/N*(1-z^{-1})=(1+z^{-N})N*(1-z^{-1})$$ EQUATION II Where:
$z=e^{j2\pi*f*Ts}$, and $T_s=1/F_s=U_{clk}/F_{clk}$ Where Uclk is the number of clock signals between updates of control signal CTRL at 114, Fclk is the frequency of the clock signal, Fs is the sampling and update frequency, and Ts is the sampling and update period. The magnitude of the averaging digital filter function is derived in EQUATION III.

$$|Avg(z)| = |Sin(N\pi f T_s)/N*Sin(\pi f T_s)| \qquad \text{EQUATION III}$$

Figure 4:
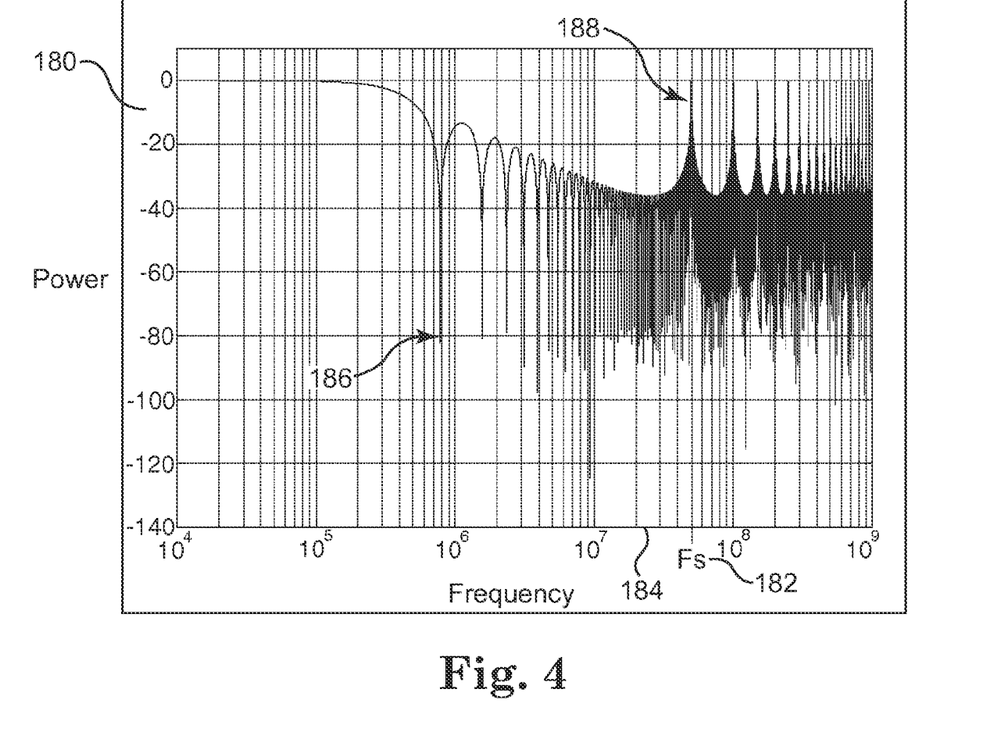
FIG. 4 is a diagram illustrating the magnitude response of one embodiment of the averaging digital filter.

FIG. 4 is a diagram illustrating the magnitude response 180 of one embodiment of the averaging digital filter 148. In this example, the frequency of the clock Fclk is equal to 200 MHz. The number of clock signals between updates of control signal CTRL at 114 Uclk is equal to 4. The sampling and update period Ts of Uclk/Fclk is equal to 20 nano-seconds and the sampling and update frequency Fs is equal to 50 Mhz at 182. The number of stored control signals N is equal to 64.

The averaging digital filter 148 has a magnitude response 180 that is similar to a notched low pass filter in a baseband from DC to the Nyquist frequency of ½ Fs at 184. The magnitude response 180 includes notches at 186. Passbands at 188 are centered around multiples of the sampling frequency Fs at 182. The passbands 188 can be as wide as plus or minus Fs/N. Noise components having frequencies within the passbands 188 are not attenuated or are attenuated very little by the averaging digital filter 148. If not otherwise filtered off, these higher frequency components are aliased down to the baseband.

In calibration circuit 100, first low pass filter 132 and second low pass filter 134 perform as anti-aliasing filters to reduce noise components and other signals within the passbands 188 of the averaging digital filter 148. The order and bandwidth BW1 of first low pass filter 132 and the order and bandwidth BW2 of second low pass filter 134 are selected to attenuate the passbands 188 of the averaging digital filter 148 and prevent aliasing in the baseband. As shown in EQUATION IV, the bandwidths BW1 and BW2 are chosen to be much lower than Fs−Fs/N, which is approximately Fs for 1/N<<1, to reject noise components and other signals within the passbands 188 of the averaging digital filter 148.

$$BW1, BW2 << F_s, \qquad \text{EQUATION IV}$$

Figure 5:
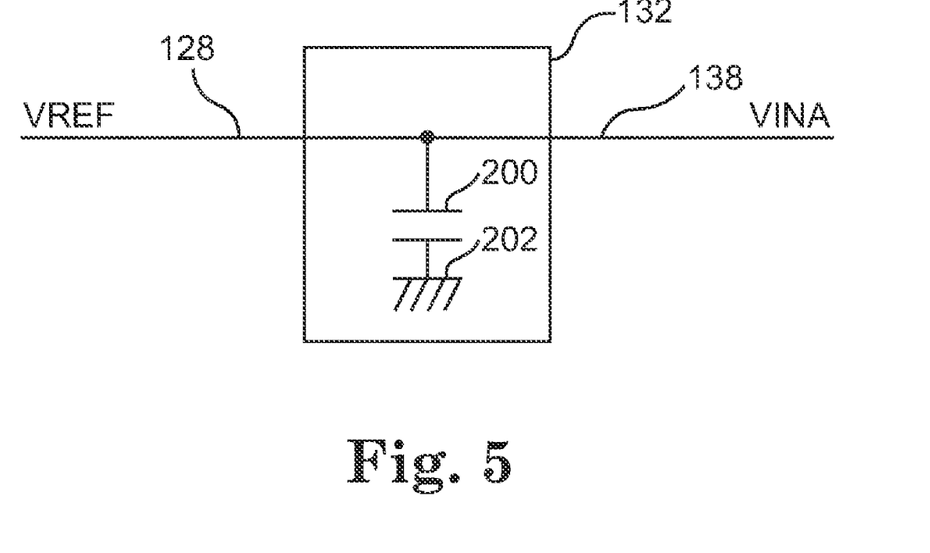
FIG. 5 is a diagram illustrating one embodiment of a first low pass filter.

FIG. 5 is a diagram illustrating one embodiment of first low pass filter 132 including capacitor 200. One side of capacitor 200 is electrically coupled to reference signal path 128 and to input path 138. The other side of capacitor 200 is electrically coupled to a reference, such as ground, at 202. First low pass filter 132 is a first order low pass filter.

First low pass filter 132 receives and low pass filters reference signal VREF at 128 and provides filtered reference signal VINA at 138. First low pass filter 132 contributes to providing a first transfer function from power supply voltage VDD at 126 to the filtered reference signal VINA at 138 and one of the inputs of comparator 136.

Figure 6:
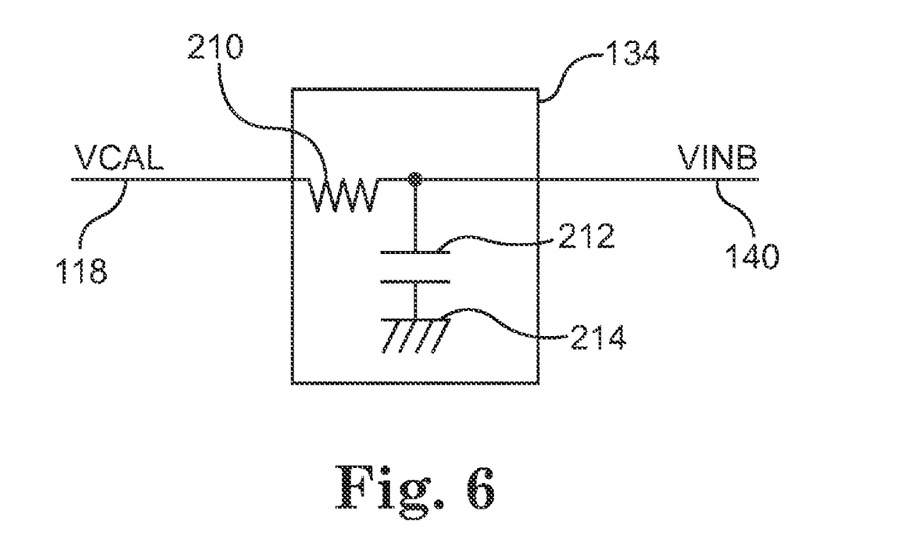
FIG. 6 is a diagram illustrating one embodiment of a second low pass filter.

FIG. 6 is a diagram illustrating one embodiment of second low pass filter 134 including a resistor 210 and a capacitor 212. One side of resistor 210 is electrically coupled to calibrated signal path 118 and the other side of resistor 210 is electrically coupled to one side of capacitor 212 via input path 140. The other side of capacitor 212 is electrically coupled to a reference, such as ground, at 214. Second low pass filter 134 is a first order low pass filter.

Second low pass filter 134 receives and low pass filters the calibrated signal VCAL at 118 and provides filtered calibrated signal VINB at 140. In addition, second low pass filter 134 contributes to providing a second transfer function from power supply voltage VDD at 124 to the filtered calibrated signal VINB at 140 and an input of comparator 136. The second transfer function is substantially the same as the first transfer function, which minimizes conversion of CM noise to differential noise at the inputs of comparator 136.

First low pass filter 132 and second low pass filter 134 perform multiple functions including operating as anti-aliasing filters for the averaging digital filter 148 and reducing CM noise in the system. Second low pass filter 134 also reduces SE noise in the system. The first low pass filter 132, second low pass filter 134, and the averaging digital filter 148 reduce the overall noise in calibration circuit 100 and improve the accuracy of the calibration result.

Second low pass filter 134 slows the transient response of filtered calibrated signal VINB at 140. If a first order filter is used for second low pass filter 134, the filtered calibrated signal VINB at 140 reaches 95% of its value after about 3 time constants of the resistor-capacitor (RC) filter. The low pass filter transient time tLPF is only part of the full loop latency tCL of calibration circuit 100. Since the comparator result at 142 is sampled via control circuit 104 after the full loop transients have died down, the sampling period Ts is greater than the full loop latency tCL.

The sampling frequency Fs is related to the bandwidth BW2 of second low pass filter 134 as shown in EQUATION V.

$$1/F_s = T_s \geq tCL > tLPF = 3\tau = 3RC = 3/(2\pi BW2) \rightarrow F_s < (2\pi BW2)/3 \approx 2*BW2 \qquad \text{EQUATION V}$$

As shown in EQUATIONS IV and V, the bandwidth BW2 needs to be much lower than Fs to reject noise components and other signals within the passbands 188 of the averaging digital filter 148 and the bandwidth BW2 needs to be greater than one-half the sampling frequency ½ Fs to satisfy the full loop settling time latency, assuming the pre-emphasis function 146 is not used. However, meeting the latter constraint leads to the near-nil attenuation of noise.

Calibration circuit 100 and control circuit 104 include the pre-emphasis function 146 to accelerate and complete the full loop transients within the sampling period Ts. Each time control circuit 104 updates control signal CTRL at 114 to increase (decrease) the filtered calibrated signal VINB at 140 one step value, the pre-emphasis function 146 provides a pre-emphasis control signal in control signal CTRL at 114. The pre-emphasis control signal adjusts output impedance ZDUC in DUC 106 to increase (decrease) the calibrated signal VCAL at 118 more than one step value and provide a pre-emphasized calibrated signal in calibrated signal VCAL at 118. After the pre-emphasis control signal, control signal CTRL at 114 provides a control signal value that maintains the one step value increase (decrease) in the filtered calibrated signal VINB at 140. The pre-emphasis calibrated signal in calibrated signal VCAL at 118 decreases the transition time of filtered calibrated signal VINB at 140 from one value to the next higher (lower) value. Since filtered calibrated signal VINB at 140 transitions more quickly from one value to the next higher (lower) value, the comparison result at 142 can be sampled and control signal CTRL at 114 can be updated at the sampling period Ts.

Figure 7:
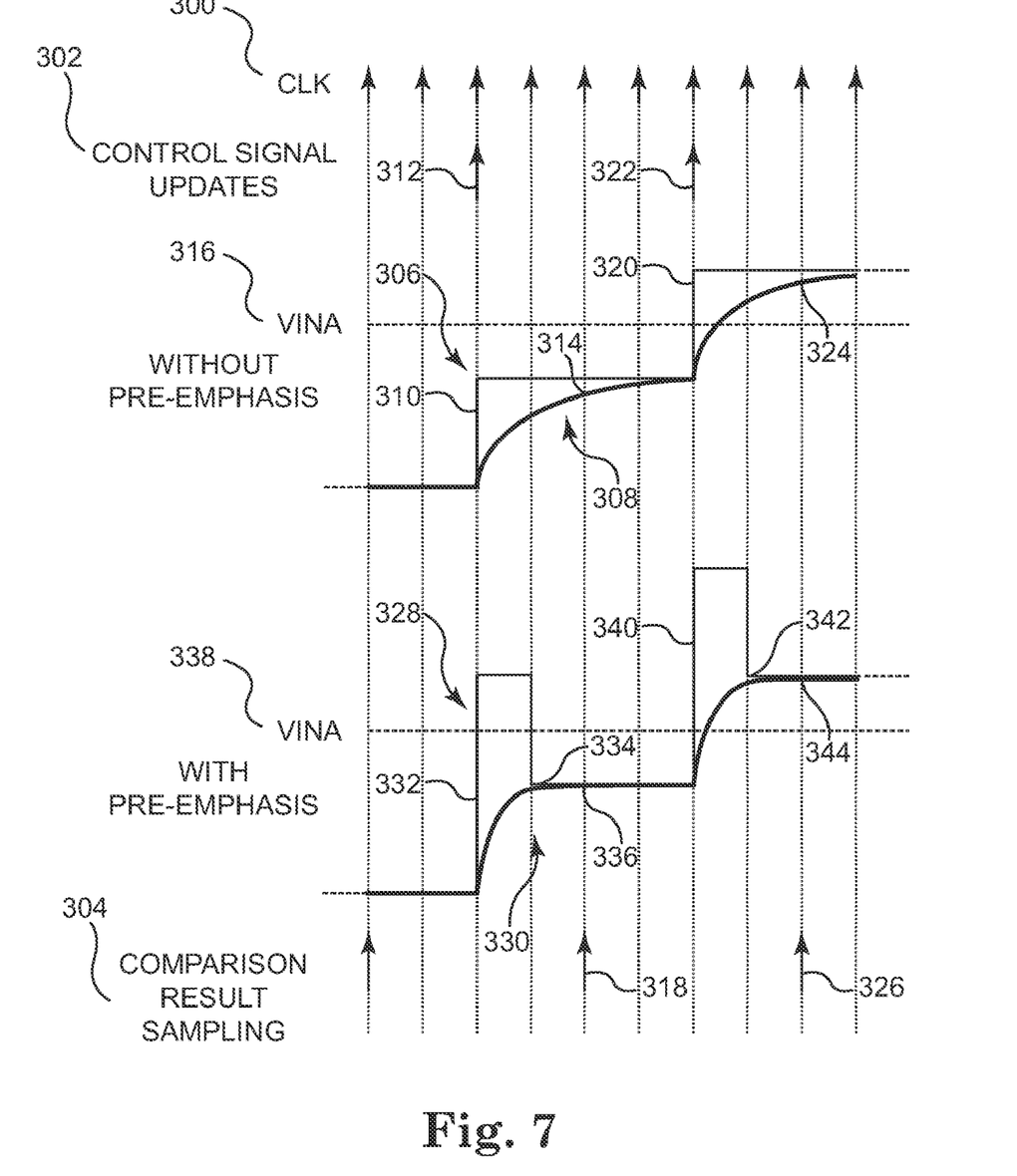
FIG. 7 is a diagram illustrating one embodiment of a pre-emphasis function.

FIG. 7 is a diagram illustrating one embodiment of pre-emphasis function 146 for a first order low pass filter. The illustrated embodiment is just one of many suitable embodiments of pre-emphasis function 146. In addition, the example that follows is just one of many suitable implementations of the illustrated embodiment. In other embodiments, pre-emphasis function 146 can provide pre-emphasis pulses at different times in the calibrated signal and for different durations.

In this example, clock signal CLK at 300 has a clock frequency of 200 MHz and a clock period of 5 nano-seconds. The control signal update edges at 302 have an update period of 4 clock cycles or 20 nano-seconds and the comparison result sampling edges at 304 have a sampling period of 4 clock cycles or 20 nano-seconds.

Control circuit 104 uses 2 clock cycles or 10 nano-seconds to generate the control signal CTRL at 114. The control signal update edges at 302 and the comparison result sampling edges at 304 are two clock cycles apart. Thus, the comparator result at 142 is sampled two clock cycles after the control signal CTRL at 114 is updated and the control signal CTRL at 114 is updated two clock cycles after the comparison result at 142 is sampled.

If the pre-emphasis function 146 is not used, calibration circuit 100 produces the calibrated signal VCAL at 306 and the filtered calibrated signal VINB at 308. The calibrated signal VCAL at 306 is increased one step value at 310 in response to updating control signal CTRL at 114 at control signal update edge 312. The filtered calibrated signal VINB at 308 reaches only a fraction, such as 63%, of its final value after two clock cycles at 314. The filtered calibrated signal VINB at 314 is compared to the filtered reference signal VINA at 316 and the comparison result at 142 is sampled via the comparison result sampling edge at 318.

The calibrated signal VCAL at 306 is increased one step value at 320 in response to updating control signal CTRL at 114 at control signal update edge 322. The filtered calibrated signal VINB at 308 reaches only a fraction, such as 63%, of its final value after two clock cycles at 324. The filtered calibrated signal VINB at 324 is compared to the filtered reference signal VINA at 316. The comparison result at 142 changes and is sampled via the comparison result sampling edge at 326. Since the filtered calibrated signal VINB at 308 reaches only a fraction of its final value, such as 63%, the comparison result at 142 could be in error.

In this example, if the pre-emphasis function 146 is used, calibration circuit 100 produces the calibrated signal VCAL at 328 and the filtered calibrated signal VINB at 330. The calibrated signal VCAL at 328 is increased two step values at 332 in response to a pre-emphasis control signal in control signal CTRL at 114. The pre-emphasis control signal is provided for 1 clock cycle or 5 nano-seconds after control signal CTRL at 114 is updated via control signal update edge 312. Next, control signal CTRL at 114 is set to provide a one step value increase and the calibrated signal VCAL at 328 settles into a one step value increase at 334. As a result of the pre-emphasis pulse 332 in the calibrated signal VCAL at 328, the filtered calibrated signal VINB at 330 reaches a full one step value increase, its final value, by two clock cycles at 336. This filtered calibrated signal VINB at 336 is compared to the filtered reference signal VINA at 338 and the comparison result at 142 is sampled via the comparison result sampling edge at 318.

At 322, control circuit 104 updates control signal CTRL at 114 to increase the filtered calibrated signal VINB one more step value based on the sampled comparison result taken at 318. The calibrated signal VCAL at 328 is increased two step values at 340 in response to a pre-emphasis control signal in control signal CTRL at 114. The pre-emphasis control signal is provided for 1 clock cycle or 5 nano-seconds after control signal CTRL at 114 is updated via control signal update edge 322. Next, control signal CTRL at 114 is set to provide a one step value increase and the calibrated signal VCAL at 328 settles into a one step value increase at 342. As a result of the pre-emphasis pulse in the calibrated signal VCAL at 328, the filtered calibrated signal VINB at 330 reaches a full one step value increase, its final value, by two clock cycles at 344. This filtered calibrated signal VINB at 344 is compared to the filtered reference signal VINA at 338. The comparison result at 142 changes and is sampled via the comparison result sampling edge at 326. Since the filtered calibrated signal VINB at 308 reaches its final value before the comparison result at 142 is sampled, the comparison result at 142 is accurate.

In one embodiment, the duration of the pre-emphasis control signal and, subsequently, the duration of the pre-emphasis calibrated signal is based on the RC time constant of second low pass filter 134, instead of a number of clock cycles. The time necessary to update the filtered calibrated signal VINB one step value $\Delta V$ is shown in EQUATION VI.

$$\Delta V = (\Delta V + \Delta V)*(1-e^{-t/\tau}) \rightarrow t = 0.69\tau \qquad \text{EQUATION VI}$$

Thus, it takes about 7 nano-seconds for the filtered calibrated signal VINB to increase or decrease one step value, and the duration of the pre-emphasis control signal is determined by a replica RC circuit to be 7 nano-seconds. Once the pre-emphasis control signal is terminated, the filtered calibrated signal VINB is maintained by a single step value change in control signal CTRL at 114.

In one embodiment, the pre-emphasis control signal in control signal CTRL at 114 is more than two step values or k step values. The time necessary to update the filtered calibrated signal VINB one step value $\Delta V$ is shown in EQUATION VII.

$$t = \tau * \ln(k+1)/k, \text{ since } \Delta V = (k+1)*\Delta V*(1-e^{-t/\tau}) \qquad \text{EQUATION VII}$$

Figure 8:
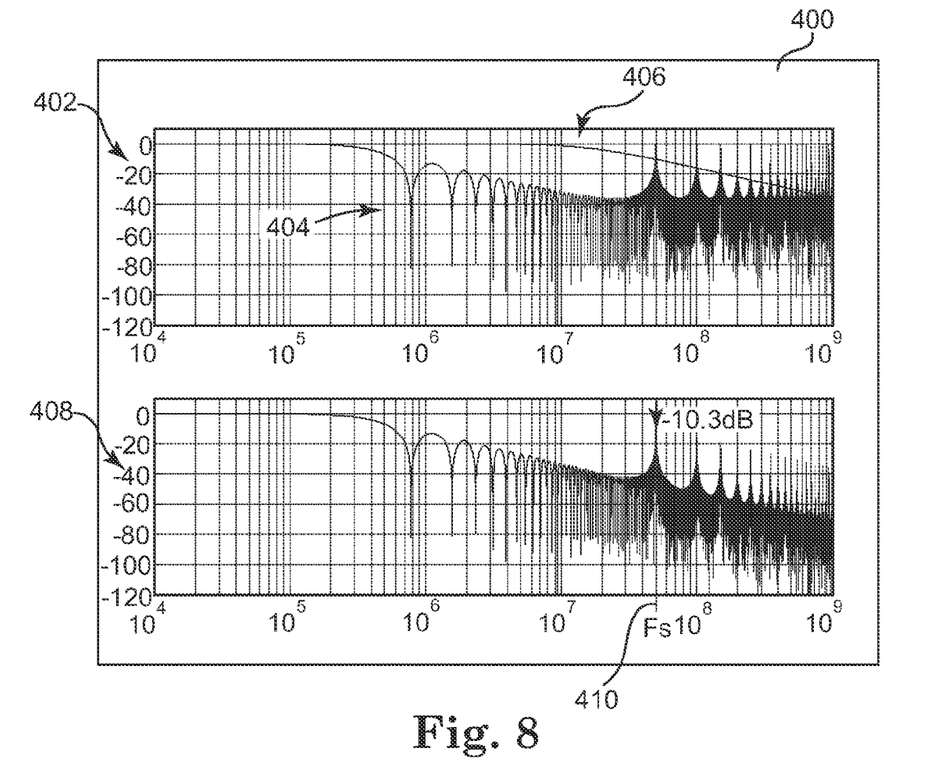
FIG. 8 is a diagram illustrating the filter transfer functions in one embodiment of a calibration circuit.

FIG. 8 is a diagram illustrating the filter transfer functions 400 in one embodiment of calibration circuit 100 of FIG. 2 including the averaging digital filter 148, first low pass filter 132 of FIG. 5, and second low pass filter 134 of FIG. 6. In this example, first resistor R1 is equal to 40 kilo-Ohms, second resistor R2 is equal to 40 kilo-Ohms, reference resistor RREF is equal to 240 Ohms, and the output impedance ZDUC of DUC 106 is calibrated to be equal to 240 Ohms. Also, capacitor 200 is equal to 497 fimpto-farads, resistor 210 is equal to 9.6 kilo-Ohms, and capacitor 212 is equal to 1.023 pico-farads.

First and second low pass filters 132 and 134 are first order RC filters with a bandwidth of about 16 MHz. The frequency of the clock Fclk is equal to 200 MHz, the number of clock signals between updates of control signal CTRL at 114 Uclk is equal to 4, the sampling and update period Ts is equal to 20 nano-seconds, and the sampling and update frequency Fs is equal to 50 Mhz. The number of control signals CTRL at 114 that are stored and averaged N is equal to 64.

The individual filter transfer functions at 402 include the averaging digital filter transfer function at 404 and the first order low pass filter transfer functions at 406. The overall filter transfer function at 408 shows that the first order low pass filters 132 and 134 achieve an attenuation of −10.3 dB of the averaging digital filter passband around the sampling frequency Fs at 410. Other passbands are attenuated further.

The calibration circuits are capable of rejecting noise to obtain accurate calibration results. The low pass filters and the averaging digital filter reduce common mode noise and single ended noise, which improves the accuracy of the calibration and provides more precisely calibrated circuit parameters. First low pass filter 132 and second low pass filter 134 function as anti-aliasing filters for the averaging digital filter 148. In addition, first low pass filter 132 and second low pass filter 134 reduce CM noise in the system. Also, second low pass filter 134 reduces SE noise in the system.

Figure 9:
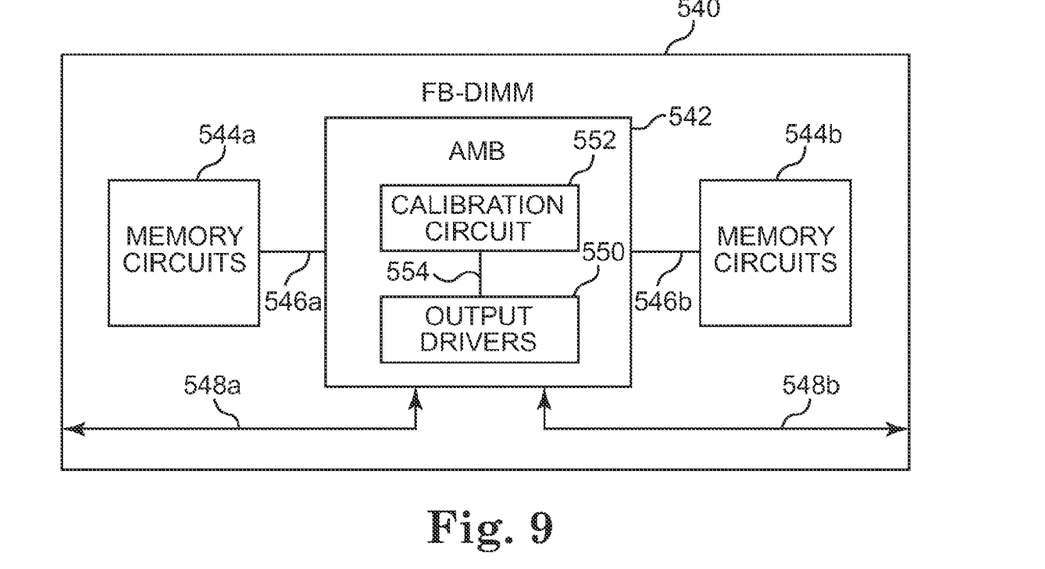
FIG. 9 is a block diagram illustrating one embodiment of an FB-DIMM that includes a calibration circuit.

FIG. 9 is a block diagram illustrating one embodiment of an FB-DIMM 540 that includes a calibration circuit 552. FB-DIMM 540 includes an AMB 542, first memory circuits 544*a*, and second memory circuits 544*b*. In one embodiment, first memory circuits 544*a* include multiple DDR-DRAM circuits and second memory circuits 544b include multiple DDR-DRAM circuits. In one embodiment, first memory circuits 544a and second memory circuits 544b include 18 DDR-DRAM circuits. In other embodiments, FB-DIMM 540 includes any suitable type and number of memory circuits.

AMB 542 is electrically coupled to each of the memory circuits in first memory circuits 544a via first memory bus 546a and to each of the memory circuits in second memory circuits 544b via second memory bus 546b. In one embodiment, first memory bus 546a is a terminated communications bus and second memory bus 546b is a terminated communications bus. In one embodiment, first memory bus 546a is a fly-by communications bus and second memory bus 546b is a fly-by communications bus.

AMB 542 is electrically coupled to primary serial links 548a and secondary serial links 548b. Primary serial links 548a include primary southbound and primary northbound serial links. Secondary serial links 548b include secondary southbound and secondary northbound serial links.

Serial data from a host controller, such as host controller 22 (shown in FIG. 1), is sent through the primary southbound link in primary serial links 548a and received by AMB 542. The serial data from the host controller is temporarily buffered and then sent to memory circuits 544a and 544b via first memory bus 546a and second memory bus 546b. The serial data contains the address, data, and command information. AMB 542 writes in and reads out data from memory circuits 544a and 544b as instructed by the host controller. The read data is converted to serial data, and sent back to the host controller via the primary northbound link in primary serial links 548a.

AMB 542 transfers serial data from the primary southbound link in primary serial links 548a, which are connected to the host controller or an upper AMB, to a lower AMB via the secondary southbound link in secondary serial links 548b. Also, AMB 542 receives serial data from a lower AMB via a secondary northbound link in secondary serial links 548b. After merging the serial data with data of its own, AMB 542 sends the serial data to an upper AMB or the host controller via a primary northbound link in primary serial links 548a.

AMB 542 includes output drivers 550 and calibration circuit 552. Each of the output drivers 550 includes adjustable output impedances. The output drivers 550 are electrically coupled to calibration circuit 552 via calibration signal path 554. In one embodiment, the output drivers 550 provide signals on primary serial links 548a and/or secondary serial links 548b. In one embodiment, the output drivers 550 provide signals on first memory bus 546a and/or second memory bus 546b.

Calibration circuit 552 calibrates the output impedance of a DUC and obtains a calibration result. Calibration circuit 552 provides the calibration result to output drivers 550 via calibration signal path 554. The calibration result calibrates the adjustable output impedances of output drivers 550 in FB-DIMM 540 to optimize signal timing and achieve higher data rates between circuits and/or chips. In one embodiment, the DUC is one of the output drivers 550 and the calibration result is used by the DUC. In one embodiment, the DUC is one of the output drivers 550 and the calibration result is used by all of the output drivers 550. In one embodiment, the DUC is similar to one of the output drivers 550 and the calibration result or a corresponding calibration result is used by all of the output drivers 550. In one embodiment, calibration circuit 552 is similar to calibration circuit 28 (shown in FIG. 1). In one embodiment, calibration circuit 552 is similar to calibration circuit 100 of FIG. 2.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a first circuit configured to provide a calibrated signal;
a second circuit configured to low pass filter the calibrated signal and provide a filtered calibrated signal;
a third circuit configured to provide a control signal; and
a fourth circuit configured to compare the filtered calibrated signal to an input signal and provide a comparison result, wherein the third circuit stores the control signal to provide stored control signal values only if the comparison result changes and the third circuit determines an average of the stored control signal values and provides the average of the stored control signal values as a calibration result to at least one other circuit.

2. The integrated circuit of claim 1, wherein the first circuit updates the calibrated signal based on the control signal.

3. The integrated circuit of claim 1, wherein the third circuit updates the control signal by incrementing and decrementing the control signal based on the comparison result.

4. The integrated circuit of claim 1, comprising a fifth circuit configured to provide the input signal via low pass filtering of a reference signal.

5. The integrated circuit of claim 1, wherein transfer functions from a power supply voltage to the input signal and from the power supply voltage to the filtered calibrated signal are substantially the same.

6. The integrated circuit of claim 1, wherein the third circuit updates the control signal at a sampling frequency and provides a pre-emphasis signal in the control signal that provides a pre-emphasis pulse in the calibrated signal that provides a substantially full final value in the filtered calibrated signal prior to sampling the filtered calibrated signal at the sampling frequency.

7. The integrated circuit of claim 1, wherein the third circuit comprises a finite state machine.

8. The integrated circuit of claim 1, wherein the third circuit provides a pre-emphasis signal in the control signal and the first circuit provides a pre-emphasis pulse in the calibrated signal based on the pre-emphasis signal.

9. The integrated circuit of claim 1, wherein the first circuit provides a pre-emphasis pulse in the calibrated signal.

10. The integrated circuit of claim 9, wherein the pre-emphasis pulse has a duration based on one of a clock period and a resistor and capacitor circuit.

11. An electronic system comprising:
a first circuit configured to provide a calibrated signal;
a second circuit configured to low pass filter the calibrated signal and provide a filtered calibrated signal;
a third circuit configured to low pass filter a reference signal and provide a filtered reference signal;
a fourth circuit configured to compare the filtered reference signal and the filtered calibrated signal and provide a comparison result; and
a fifth circuit configured to update a control signal based on the comparison result and to store the control signal to provide stored control signal values only if the comparison result changes, wherein:

the fifth circuit sweeps the control signal in one direction to sweep the calibrated signal in one direction until the comparison result changes and the fifth circuit stores the control signal that causes the comparison result to change as one of the stored control signal values, thereafter the fifth circuit sweeps the control signal in another direction to sweep the calibrated signal in the other direction until the comparison result changes and the fifth circuit stores the control signal that causes the comparison result to change as another one of the stored control signal values, wherein each of the stored control signal values is stored in response to the comparison result changing;

the fifth circuit updates the control signal at a sampling frequency and provides a pre-emphasis signal in the control signal that provides a pre-emphasis pulse in the calibrated signal that provides a substantially full final value in the filtered calibrated signal prior to sampling the comparison result at the sampling frequency; and the fifth circuit determines an average of the stored control signal values and provides the average of the stored control signal values as a calibration result to at least one other circuit.

12. A method of calibrating comprising:
providing a calibrated signal based on a control signal;
filtering the calibrated signal via a first low pass filter to provide a filtered calibrated signal;
providing the control signal based on the filtered calibrated signal;
comparing the filtered calibrated signal to an input signal to provide a comparison result;
storing the control signal to provide stored control signal values only if the comparison result changes;
averaging the stored control signal values to provide an average of the stored control signal values; and
providing the average of the stored control signal values as a calibration result from a control circuit to at least one other circuit.

13. The method of claim 12, wherein providing the control signal comprises:
updating the control signal by incrementing and decrementing the control signal based on the comparison result.

14. The method of claim 12, comprising:
filtering a reference signal via a second low pass filter to provide the input signal.

15. The method of claim 12, wherein providing the control signal comprises updating the control signal at a sampling frequency and providing a pre-emphasis signal in the control signal and wherein providing a calibrated signal comprises providing a pre-emphasis pulse in the calibrated signal in response to the pre-emphasis signal to provide a substantially full final value in the filtered calibrated signal prior to sampling the filtered calibrated signal at the sampling frequency.

16. The method of claim 12, wherein providing the control signal comprises providing a pre-emphasis signal in the control signal and providing a calibrated signal comprises providing a pre-emphasis pulse in the calibrated signal based on the pre-emphasis signal.

17. A method of calibrating using a control circuit, comprising:
providing a calibrated signal;
filtering the calibrated signal via a first low pass filter to provide a filtered calibrated signal;
filtering a reference signal via a second low pass filter to provide a filtered reference signal;
comparing the filtered reference signal and the filtered calibrated signal to provide a comparison result to the control circuit;
updating a control signal from the control circuit at a sampling frequency and based on the comparison result to control the calibrated signal;
storing the control signal via the control circuit to provide stored control signal values only if the comparison result changes, wherein storing the control signal comprises:
sweeping the control signal in one direction to sweep the calibrated signal in one direction until the comparison result changes;
storing the control signal that causes the comparison result to change as one of the stored control signal values; and thereafter
sweeping the control signal in another direction to sweep the calibrated signal in the other direction until the comparison result changes; and
storing the control signal that causes the comparison result to change as another one of the stored control signal values, wherein each of the stored control signal values is stored in response to the comparison result changing;
providing a pre-emphasis signal in the control signal from the control circuit;
providing a pre-emphasis pulse in the calibrated signal in response to the pre-emphasis signal to provide a substantially full final value in the filtered calibrated signal prior to updating the control signal at the sampling frequency;
averaging the stored control signal values to obtain an average of the stored control signal values; and
providing the average of the stored control signal values as a calibration result from the control circuit to at least one circuit.

* * * * *